US007051153B1

(12) United States Patent
Lin et al.

(10) Patent No.: US 7,051,153 B1
(45) Date of Patent: May 23, 2006

(54) MEMORY ARRAY OPERATING AS A SHIFT REGISTER

(75) Inventors: Yi-Wen Lin, San Jose, CA (US); Changsong Zhang, San Jose, CA (US); David Jefferson, Morgan Hill, CA (US); Srinivas Reddy, Fremont, CA (US)

(73) Assignee: Altera Corporation, Fremont, CA (US)

( * ) Notice: Subject to any disclaimer, the term of this patent is extended or adjusted under 35 U.S.C. 154(b) by 255 days.

(21) Appl. No.: 10/140,312

(22) Filed: May 6, 2002

Related U.S. Application Data (60) Provisional application No. 60/289,181, filed on May 6, 2001.

(51) Int. Cl.
*G06F 12/00* (2006.01)

(52) U.S. Cl. .................... 711/109; 711/104; 711/105; 711/111; 711/154; 711/170; 711/173; 365/189.12; 365/221

(58) Field of Classification Search ................ 711/154, 711/217, 1, 100–101, 103–111, 170, 173; 377/61, 79; 365/189.12, 221, 189
See application file for complete search history.

(56) References Cited

U.S. PATENT DOCUMENTS

| | | | | |
|---|---|---|---|---|
| 4,796,231 A | * | 1/1989 | Pinkham | ................ 365/189.05 |
| 5,430,687 A | * | 7/1995 | Hung et al. | ............. 365/230.08 |
| 5,675,589 A | * | 10/1997 | Yee | ............................... 714/30 |
| 5,889,413 A | | 3/1999 | Bauer | |
| 6,061,417 A | | 5/2000 | Kelem | |
| 6,088,783 A | * | 7/2000 | Morton | ........................ 712/22 |
| 6,118,298 A | * | 9/2000 | Bauer et al. | ................... 326/39 |
| 6,262,597 B1 | | 7/2001 | Bauer et al. | |
| 6,288,568 B1 | | 9/2001 | Bauer et al. | |
| 6,388,466 B1 | * | 5/2002 | Wittig et al. | ................... 326/40 |
| 6,411,124 B1 | | 6/2002 | Lee et al. | |
| 6,462,577 B1 | | 10/2002 | Lee et al. | |
| 6,658,557 B1 | * | 12/2003 | McCoy et al. | .............. 712/227 |
| 2004/0015758 A1 | * | 1/2004 | Pathak et al. | ................ 714/725 |

OTHER PUBLICATIONS

U.S. Appl. No. 09/761,609, filed Jan. 16, 2001, Lee et al.

* cited by examiner

*Primary Examiner*—Donald Sparks
*Assistant Examiner*—Hashem Farrokh
(74) *Attorney, Agent, or Firm*—Townsend and Townsend and Crew, LLP (57) ABSTRACT

A memory array configured to operate as a shift register includes a first column of memory cells with an input and an output and at least a second column of memory cells with an input and an output. The memory array also includes a multiplexer that is connected between the output of the first column of memory cells and the input of the second column of memory cells. The memory array can be operated as a shift register by shifting data from the first column of memory cells to the second column of memory cells through the multiplexer rather than using general routing lines.

22 Claims, 11 Drawing Sheets

16-bit Shift Register State Table

| Clock Cycle | Read & Write Address | Data Read in Col./Cell Location | | | | Data Written in Col./Cell Location | | | |
|---|---|---|---|---|---|---|---|---|---|
| | | 11 | 10 | 01 | 00 | 11 | 10 | 01 | 00 |
| 1H | 00 | x | x | x | x | x | x | x | x |
| 1L | 00 | x | x | x | x | 1/m | x | x | x |
| 2H | 01 | x | x | x | x | 1/m | x | x | x |
| 2L | 01 | x | x | x | x | 2/n | x | x | x |
| 3H | 10 | x | x | x | x | 2/n | x | x | x |
| 3L | 10 | x | x | x | x | 3/o | x | x | x |
| 4H | 11 | x | x | x | x | 3/o | x | x | x |
| 4L | 11 | x | x | x | x | 4/p | x | x | x |
| 5H | 00 | 1/m | x | x | x | 4/p | x | x | x |
| 5L | 00 | 1/m | x | x | x | 5/m | 1/i | x | x |
| 6H | 01 | 2/n | x | x | x | 5/m | 1/i | x | x |
| 6L | 01 | 2/n | x | x | x | 6/n | 2/j | x | x |
| 7H | 10 | 3/o | x | x | x | 6/n | 2/j | x | x |
| 7L | 10 | 3/o | x | x | x | 7/o | 3/k | x | x |
| 8H | 11 | 4/p | x | x | x | 7/o | 3/k | x | x |
| 8L | 11 | 4/p | x | x | x | 8/p | 4/l | x | x |
| 9H | 00 | 5/m | 1/i | x | x | 8/p | 4/l | x | x |
| 9L | 00 | 5/m | 1/i | x | x | 9/m | 5/i | 1/e | x |
| 10H | 01 | 6/n | 2/j | x | x | 9/m | 5/i | 1/e | x |
| 10L | 01 | 6/n | 2/j | x | x | 10/n | 6/j | 2/f | x |
| 11H | 10 | 7/o | 3/k | x | x | 10/n | 6/j | 2/f | x |
| 11L | 10 | 7/o | 3/k | x | x | 11/o | 7/k | 3/g | x |
| 12H | 11 | 8/p | 4/l | x | x | 11/o | 7/k | 3/g | x |
| 12L | 11 | 8/p | 4/l | x | x | 12/p | 8/l | 4/h | x |
| 13H | 00 | 9/m | 5/i | 1/e | x | 12/p | 8/l | 4/h | x |
| 13L | 00 | 9/m | 5/i | 1/e | x | 13/m | 9/i | 5/e | 1/a |
| 14H | 01 | 10/n | 6/j | 2/f | x | 13/m | 9/i | 5/e | 1/a |
| 14L | 01 | 10/n | 6/j | 2/f | x | 14/n | 10/j | 6/f | 2/b |
| 15H | 10 | 11/o | 7/k | 3/g | x | 14/n | 10/j | 6/f | 2/b |
| 15L | 10 | 11/o | 7/k | 3/g | x | 15/o | 11/k | 7/g | 3/c |
| 16H | 11 | 12/p | 8/l | 4/h | x | 15/o | 11/k | 7/g | 3/c |
| 16L | 11 | 12/p | 8/l | 4/h | x | 16/p | 12/l | 8/h | 4/d |

Note: Clock H -> Read Cycle
Clock L -> Write Cycle
/m = data/cell location
For instance, 1/m means the first bit of data read or written at cell location m.

| 8 | 4 | x | x |
|---|---|---|---|
| 7 | 3 | x | x |
| 6 | 2 | x | x |
| 5 | 1 | x | x |

| 8 | 4 | x | x |
|---|---|---|---|
| 7 | 3 | x | x |
| 6 | 2 | x | x |
| 9 | 5 | 1 | x |

| 8 | 4 | x | x |
|---|---|---|---|
| 7 | 3 | x | x |
| 6 | 2 | x | x |
| 9 | 5 | 1 | x |

| 8 | 4 | x | x |
|---|---|---|---|
| 7 | 3 | x | x |
| 10 | 6 | 2 | x |
| 9 | 5 | 1 | x |

MEMORY ARRAY OPERATING AS A SHIFT REGISTER

CROSS REFERENCE TO RELATED APPLICATIONS

The present application claims the benefit of earlier filed provisional application U.S. Ser. No. 60/289,181, entitled MEMORY BLOCK OPERATING AS A SHIFT REGISTER, filed on May 6, 2001, the entire content of which is incorporated herein by reference.

BACKGROUND

1. Field of the Invention

The present invention generally relates to memory arrays, and more particularly to operating a memory array as a shift register.

2. Description of the Related Art

Conventional shift registers typically include a number of flip-flops connected together with the output from one flip-flop connected to the input of the next flip-flop. In response to a clock signal, data is shifted along the chain of flip-flips.

In addition to flip-flips, the cells of a memory array can be operated as a shift register by shifting data between the cells of the memory array. However, in conventional approaches to operating a memory array as a shift register, data is typically shifted between the cells of the memory array by transferring data out of the memory array then back into the memory using general routing lines. As such, these conventional approaches can result in delay and consume valuable and limited general routing capacity.

SUMMARY

The present invention relates to operating a memory array as a shift register. In one embodiment, the memory array includes a first column of memory cells with an input and an output and at least a second column of memory cells with an input and an output. The memory array also includes a multiplexer that is connected between the output of the first column of memory cells to the input of the second column of memory cells. In use, data can be shifted from the first column of memory cells to the second column of memory cells through the multiplexer rather than using general routing lines.

DESCRIPTION OF THE DRAWING FIGURES

The present invention can be best understood by reference to the following description taken in conjunction with the accompanying drawing figures, in which like parts may be referred to by like numerals:

FIGS. 4-1H to 4-16L depict the contents of the cells of the memory array of FIG. 2 in accordance with the state table depicted in FIG. 3.

DETAILED DESCRIPTION

In order to provide a more thorough understanding of the present invention, the following description sets forth numerous specific details, such as specific configurations, parameters, and the like. It should be recognized, however, that such description is not intended as a limitation on the scope of the present invention, but is intended to provide a better description of exemplary embodiments.

Figure 1:
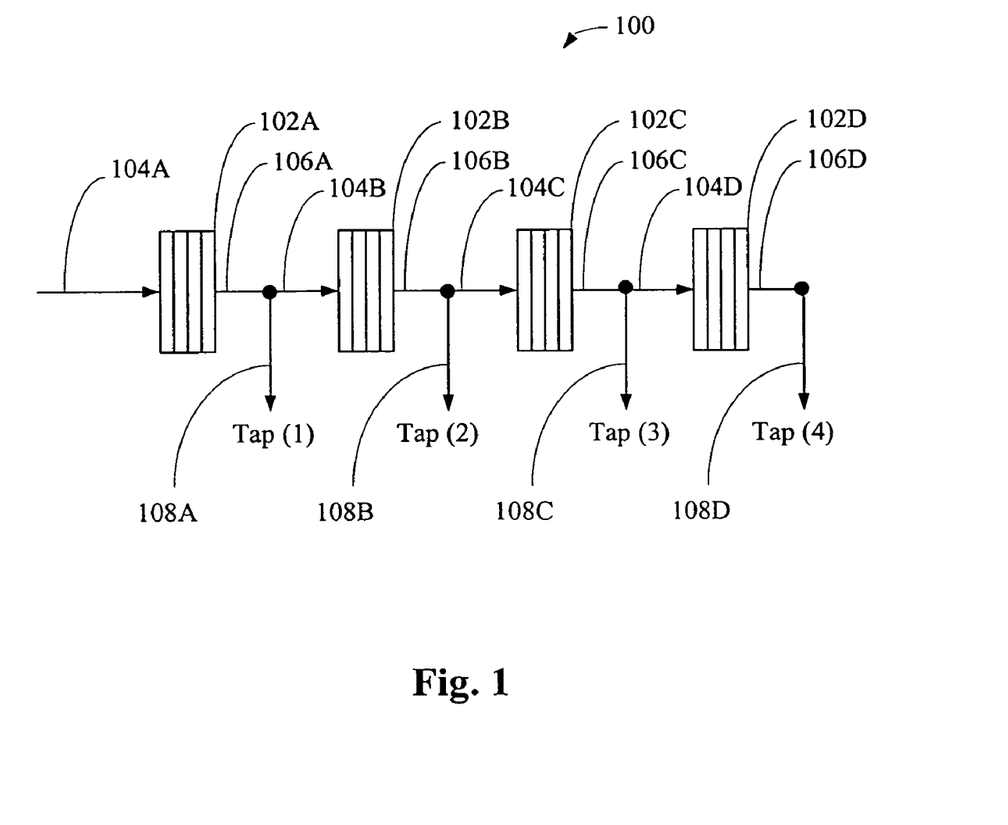
FIG. 1 is a simplified block diagram of an exemplary shift register.
Figures 1H, 4:
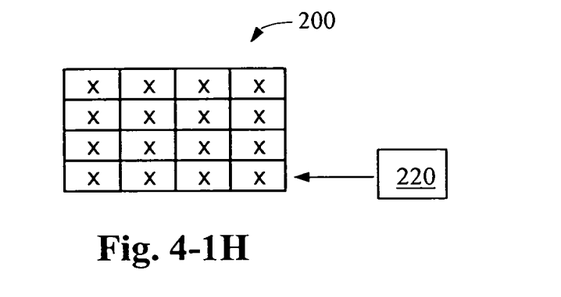
Figures 1L, 4:
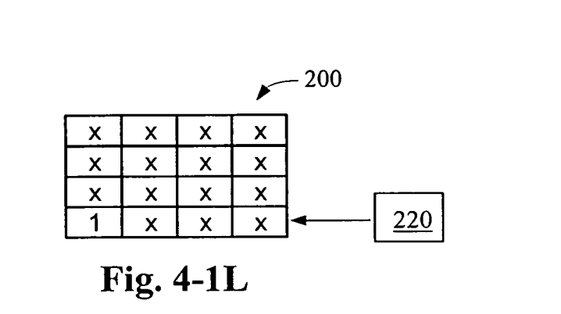

With reference to FIG. 1, an exemplary 16-bit shift register 100 is depicted. Shift register 100 includes four sets of registers 102, inputs 104, outputs 106, and taps 108. In operation, data is first received through input 104A and written into register 102A. As depicted in FIG. 1, each register 102 is 4-bits long. As such, when more than 4-bits of data are received, data is shifted from register 102A to 102B through output 106A and input 104B. When more than 8-bits of data are received, data is shifted from register 102B to 102C through output 106B and input 104C. When more than 12-bits of data are received, data is shifted from register 102C to 102D through output 106C to input 104D. When more than 16-bits of data are received, data is shifted out of register 102D through output 106D. It should be recognized that registers 102 can be any number of bits long, and shift register 100 can include any number of registers 102 and can be any number of bits long.

In the present embodiment, shift register 100 also includes 4 taps 108. More particularly, taps 108A, 108B, 108C, and 108D are connected to outputs 106A, 106B, 106C, and 106D, respectively, of registers 102A, 102B, 102C, and 102D, respectively. Thus, shift register 100 can be used to delay the incoming data by 4, 8, 12, and 16 cycles. It should also be recognized that the number and location of taps 108 can vary.

Figure 2:
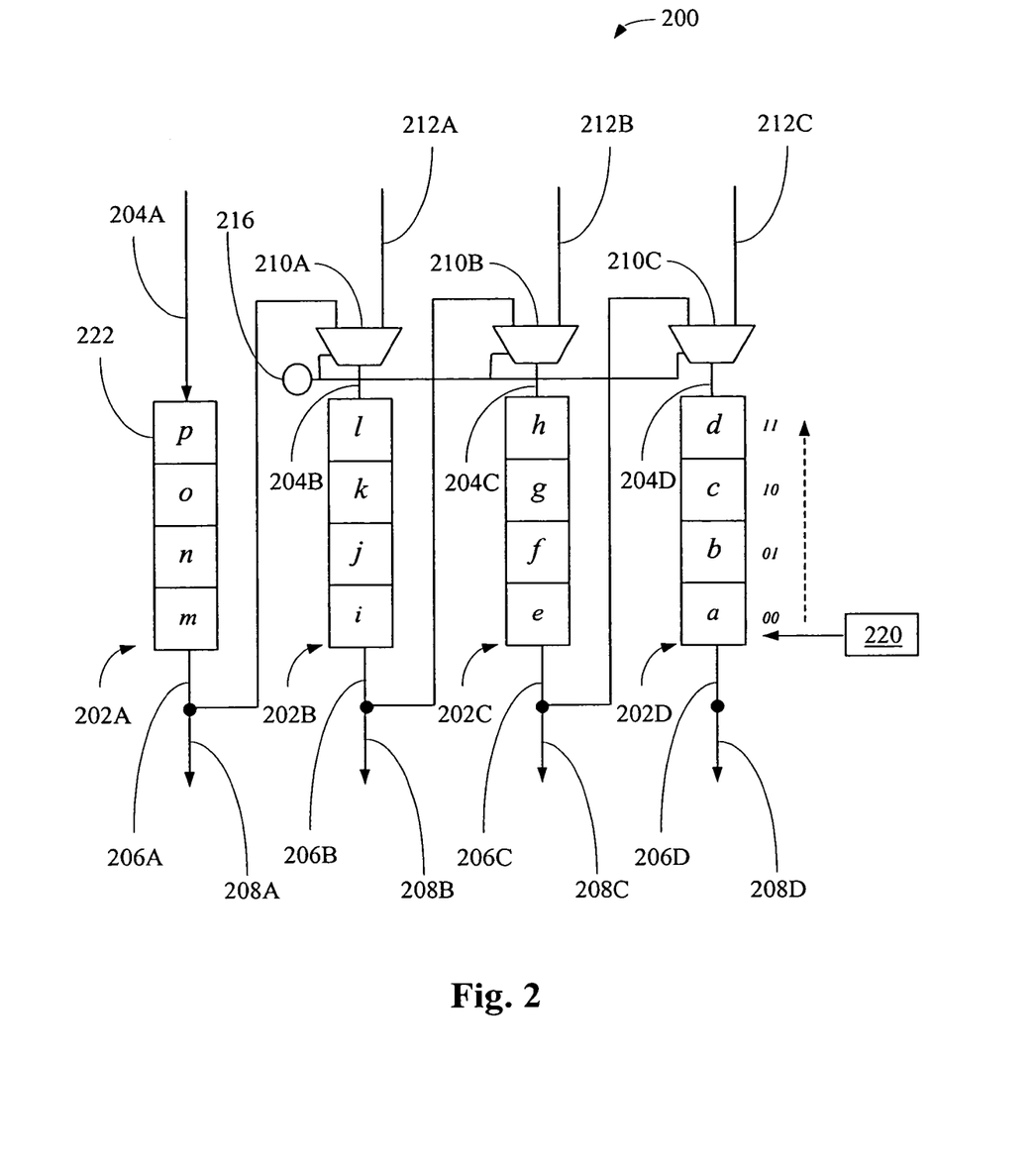
FIG. 2 is a block diagram of an exemplary memory array configured to operate as a shift register.
Figures 2H, 4:
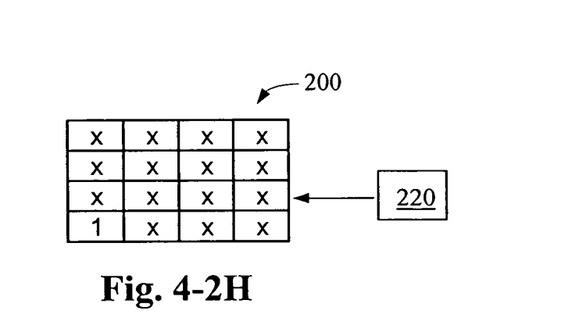
Figures 2L, 4:
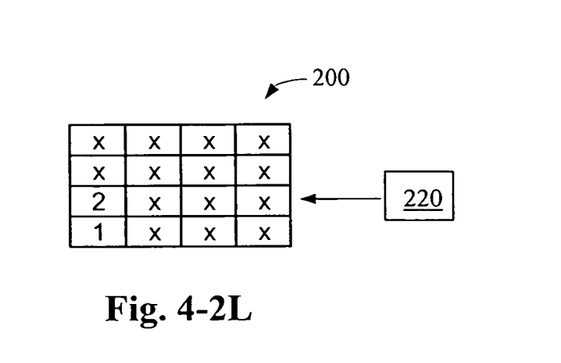

With reference now to FIG. 2, a memory array 200 can be configured to operate as a shift register. More particularly, as described below, memory array 200 can be configured to operate as 16-bit shift register 100 (FIG. 1).

In the present embodiment, memory array 200 includes a plurality of memory cells 222 that are arranged in columns 202. Each column 202 of memory array 200 is configured to operate as the functional equivalent of each register 102 (FIG. 1) of shift register 100 (FIG. 1). More particularly, each column 202A, 202B, 202C, and 202D includes 4 cells 222 and an input 204 and an output 206. As such, when more than 4-bits of data are received, data is shifted from column 202A to 202B through output 206A and input 204B. When more than 8-bits of data are received, data is shifted from column 202B to 202C through output 206B and input 204C. When more than 12-bits of data are received, data is shifted from column 202C to 202D through output 206C to input 204D. When more than 16-bits of data are received, data is shifted out of column 202D through output 206D. It should be recognized that the size and number of columns 202 can vary. For example, memory array 200 can include n numbers of columns having m numbers of cells.

As depicted in FIG. 2, memory array 200 also includes taps 208 connected to outputs 206 of columns 202. More particularly, taps 208A, 208B, 208C, and 208D are connected to outputs 206A, 206B, 206C, and 206D, respectively, of columns 202A, 202B, 202C, and 202D, respectively. Thus, similar to shift register 100, memory array 200 can be used to delay the incoming data by 4, 8, 12, and 16 cycles. It should be recognized that the number and location of taps 108 can vary.

As discussed earlier, in conventional approaches to operating a memory array as a shift register, data is typically shifted by reading the data out of the memory array and writing the data back into the memory array using general routing lines. As also discussed earlier, these conventional approaches can result in delays and consume valuable and limited general routing capacity. As such, as will be described below, in the present embodiment, memory array 200 is configured to operate as a shift register while keeping the data within memory array 200 when the data is shifted. As such, delays can be avoided and general routing capacity can be conserved.

In the present embodiment, memory array 200 includes a multiplexer 210 connected to the write path of each column 202, except for the first column 202A. More particularly, multiplexer 210A is connected between output 206A of column 202A and input 204B of column 202B. Multiplexer 210B is connected between output 206B of column 202B and input 204C of column 202C. Multiplexer 210C is connected between output 206C of column 202C and input 204D of column 202D. In one preferred embodiment, one input of each multiplexer 210 is connected to the sense amp output of the previous column 202.

As also depicted in FIG. 2, each multiplexer 210 is connected to a switch 216. When switch 216 is in a first mode (i.e., a normal-memory mode), memory array 200 functions as a normal memory array. As such, columns 202B, 202C, and 202D receive data input from data line 212A, 212B, and 212C, respectively, that connect to the data pins of the memory and eventually the general routing lines. When switch 216 is in a second mode (i.e., a shift-register mode), memory array 200 functions as a shift register. As such, columns 202B, 202C, and 202D receive data inputs from outputs 206A, 206B, and 206C, respectively. As such, memory array 200 can be operated as both a normal memory and as a shift register. In one preferred embodiment, switch 216 is configured as a RAM bit.

Additionally, in FIG. 2, each multiplexer 210 is depicted connected to a single switch 216. It should be recognized, however, that any number of multiplexers 210 can be connected to any number of switches 216. For example, each multiplexer 210 can be connected to a separate switch 216. The separate switches 216 can be used to adjust the size of memory array 200. More specifically, multiplexers 210A, 210B, and 210C can be connected to a first, second, and third switch 216. Thus, if the first and second switches 216 are switched to the second mode while the third switch remains in the first mode, memory array 200 can operate as a shift register with two registers. If the first, second, and third switches 216 are switched to the second mode, memory 200 can operate as a shift register with three registers.

In the present embodiment, an address counter 220 is used to store the read and write row address of memory array 200. As depicted in FIG. 2, memory array 200 includes 4 rows of memory cells 222. As such, address counter 220 is a 2-bit counter. However, it should be recognized that memory array 200 can include any number of rows. As such, address counter 220 is configure to have the number of states that corresponds to the number of rows in memory array 200. In one preferred embodiment, address counter 220 is configured to drive the row decoder inputs of memory array 200.

In the present embodiment, one row of memory array 200 is read and written in one full clock cycle with the row being read in the first half cycle and written in the second half cycle. For example, assume that address counter 220 points to row "00." As depicted in FIG. 2, row "00" of memory array 200 includes memory cells "m", "i", "e", and "a". As such, in the first half cycle, row "00" and thus cells "m", "i", "e", and "a" are read. In the second half cycle, row "00" and thus cells "m", "i", "e", and "a" are written. In this manner, as will be described in greater detail below, data can be read out from one cell 222 in one column 202 into another cell 222 in another column 202 to effectively shift the data without using the general routing lines.

After completion of a full cycle, address counter 220 is incremented by 1 to the next row address. When the final row is reached, the address counter 220 is reset to the starting row address. As such, in the present embodiment, address counter 220 increments from row "00" to "01"to "10" to "11", then resets to row "00". It should be recognized that any number of cycles can be used as read and write cycles.

Figure 3:
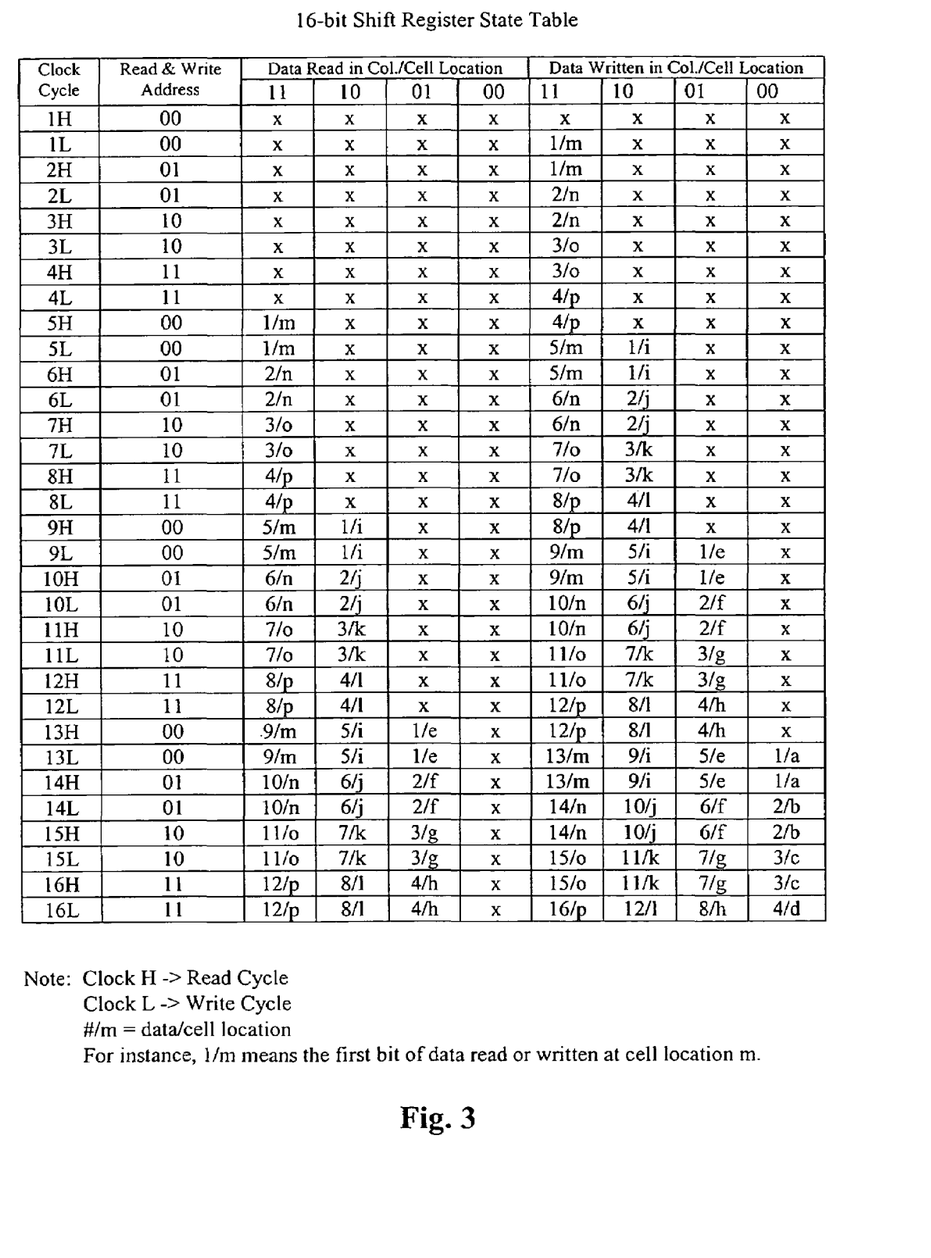
FIG. 3 is an exemplary state table for the memory array depicted in FIG. 2.
Figures 3H, 4:
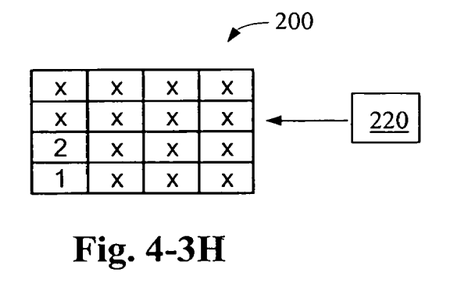
Figures 3L, 4:
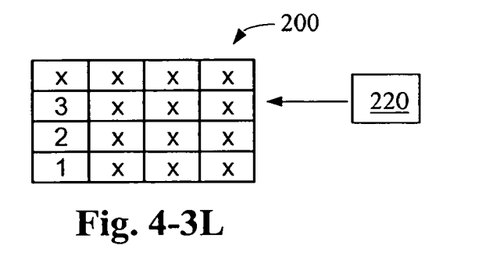
Figures 4, 4H:
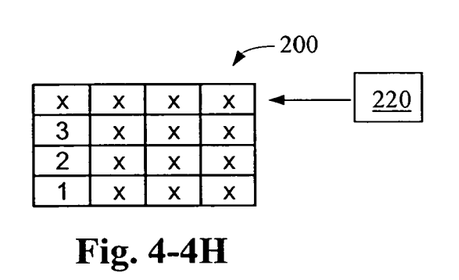
Figures 4, 4L:
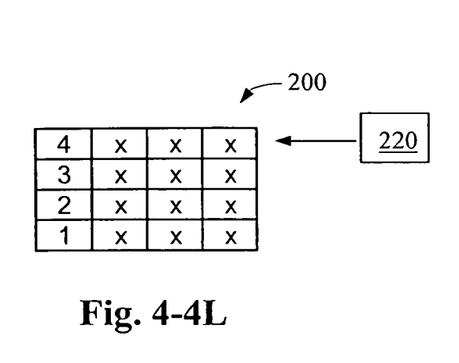
Figures 4, 5H:
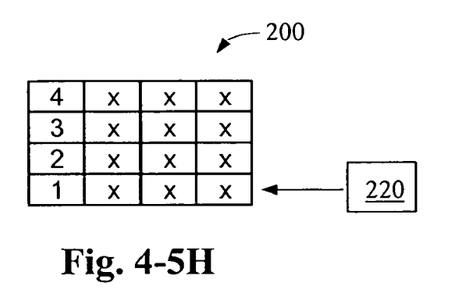
Figures 4, 5L:
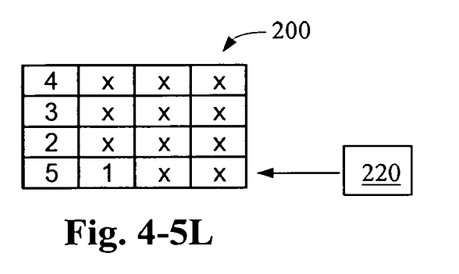
Figures 4, 6H:
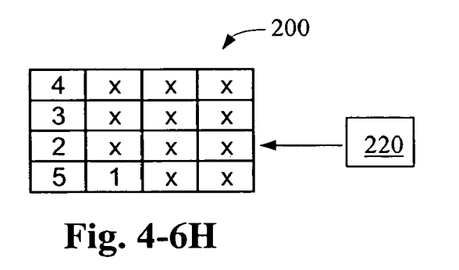
Figures 4, 6L:
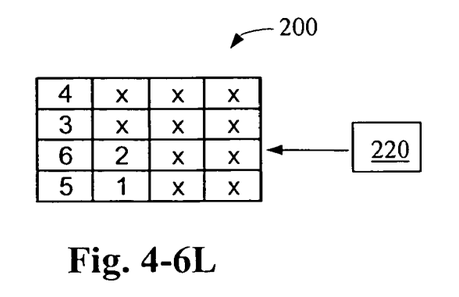
Figures 4, 7H:
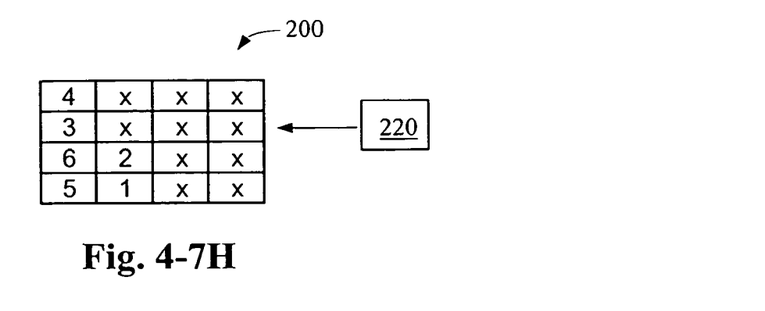
Figures 4, 7L:
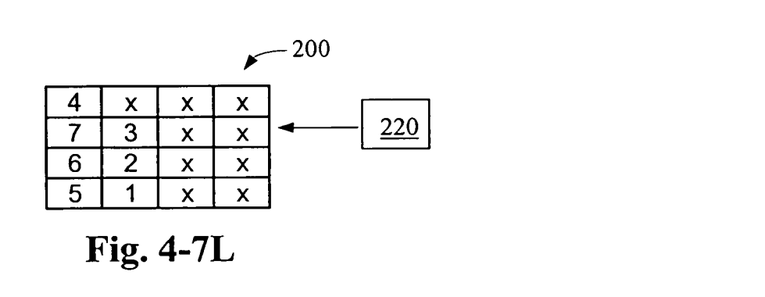
Figures 4, 8H:
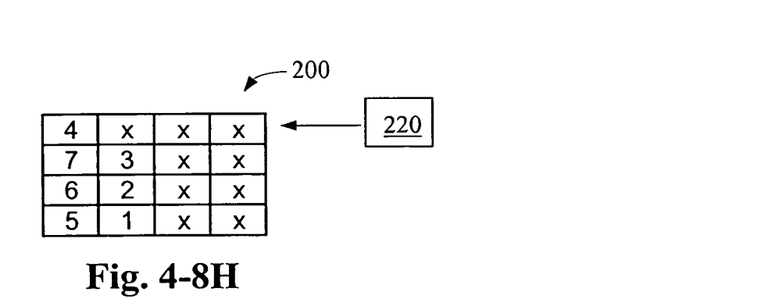
Figures 4, 8L:
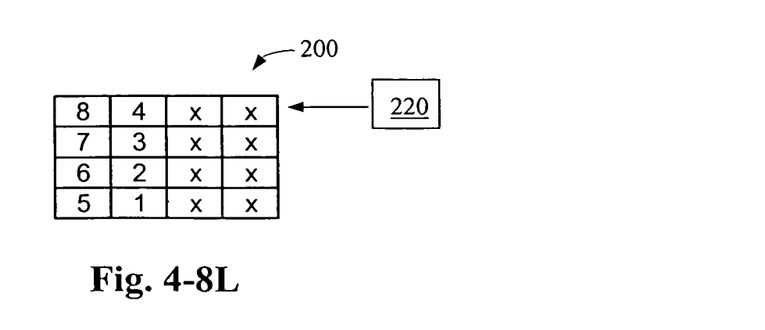
Figures 4, 9H:
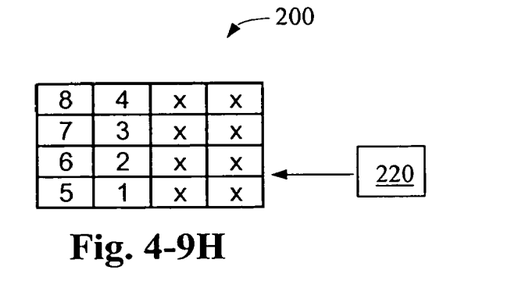
Figures 4, 9L:
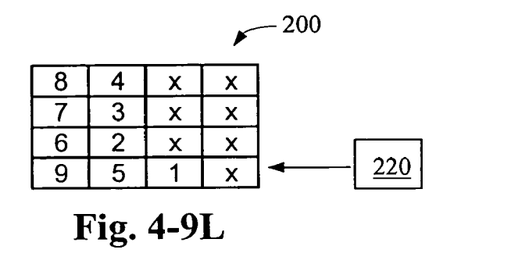
Figures 4, 10H:
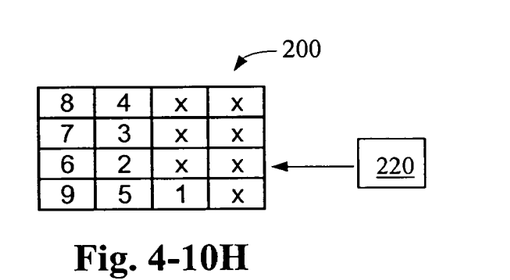
Figures 4, 10L:
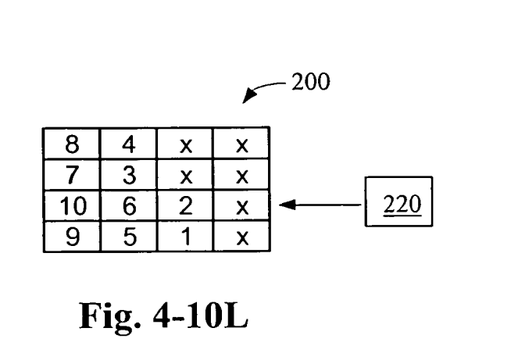
Figures 4, 11H:
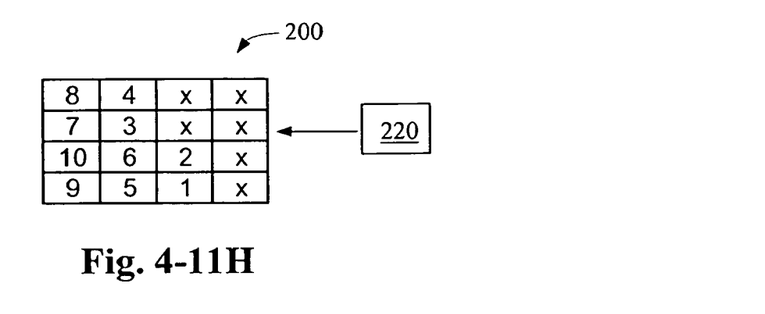
Figures 4, 11L:
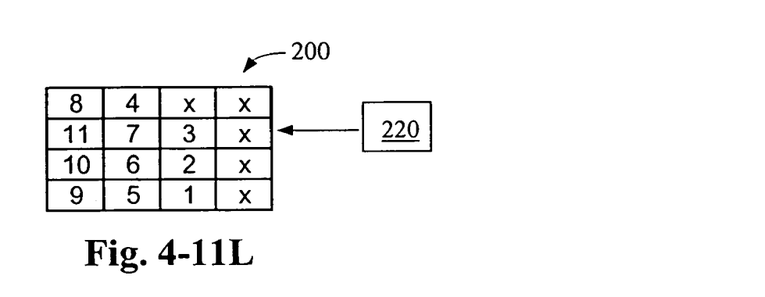
Figures 4, 12H:
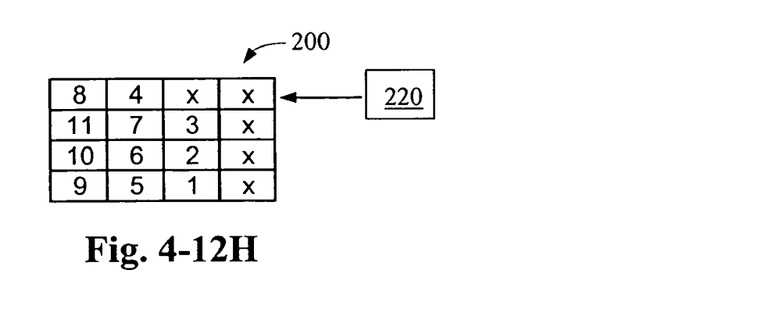
Figures 4, 12L:
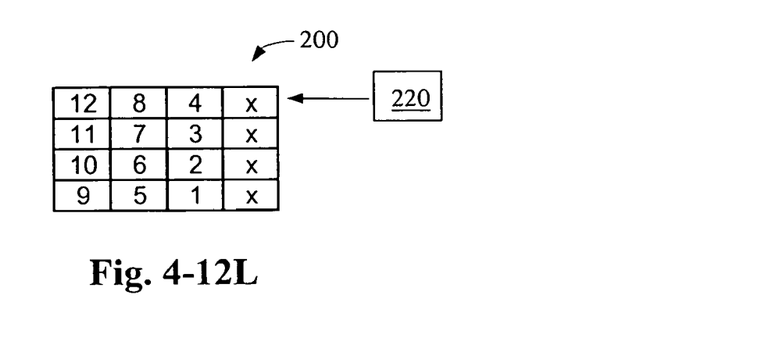
Figures 4, 13H:
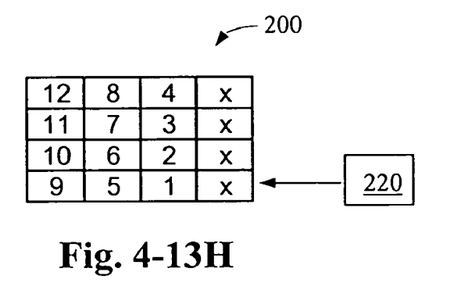
Figures 4, 13L:
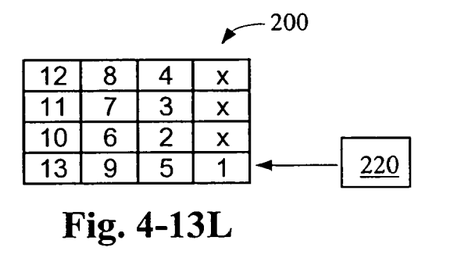
Figures 4, 14H:
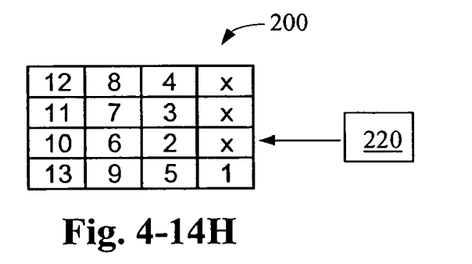
Figures 4, 14L:
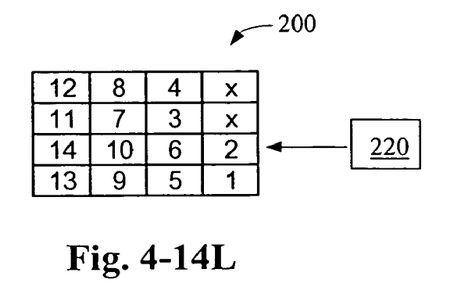
Figures 4, 15H:
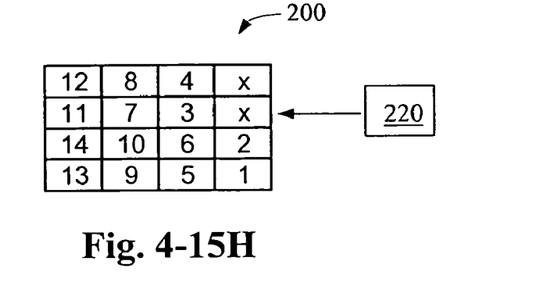
Figures 4, 15L:
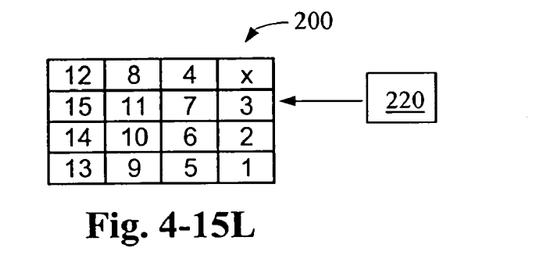
Figures 4, 16H:
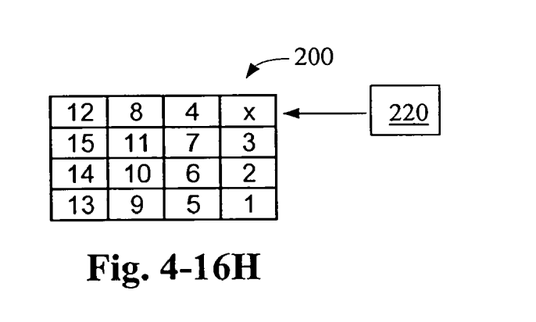
Figures 4, 16L:
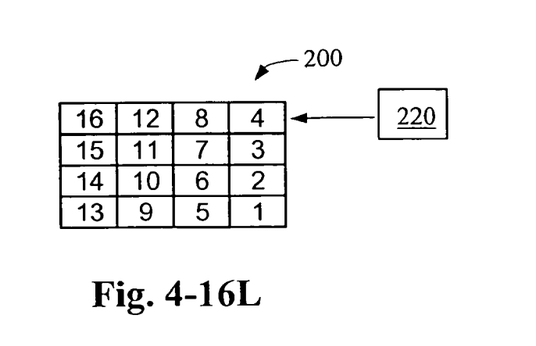

With reference now to FIG. 3, an exemplary state table is depicted for memory array 200 (FIG. 2) as data is read and written into memory array 200 (FIG. 2). As described above, in the present embodiment, one row of memory array 200 (FIG. 2) is read and written in each full cycle. More specifically, one row of memory array 200 (FIG. 2) is read in the first half of the cycle and the same row is then written in the second half of the cycle. As such, each row of the state table depicted in FIG. 3 corresponds to a half cycle.

Additionally, for the sake of example, the state table depicts the sequence in which cells 222 (FIG. 2) are read and written as a 16-bit stream of data is received. FIGS. 4-1H to 4-16L depict graphically the sequence in which cells 222 (FIG. 2) are read and written as the 16-bit stream of data is received. It should be noted that the numbers used in FIG. 2 and FIGS. 4-1H to 4-16L to represent the data bit in a particular cell 222 (FIG. 2) do not represent the actual data in the particular cell 222. Instead, the numbers merely distinguish one bit of the data from another bit. For example, the state table indicates that during the first write cycle (1L) data "1" is written to cell "m". This does not mean that the number 1 is written to cell "m". Instead, in the context of the present example, the first bit of the incoming data stream is written to cell "m".

With this in mind, for the sake of clarity, the first five full cycles will now be described. With reference to FIG. 3, during the first read cycle (1H), row 00 is read. As such, with reference to FIGS. 4-1H, address counter 220 points to row 00, and cells "m", "i", "e", and "a" (FIG. 2) are read. As depicted in FIGS. 4-1H, in the present example, memory array 200 remains unchanged.

With reference to FIG. 3, during the first write cycle (1L), row 00 is written. As such, with reference to FIGS. 4-1L, address counter 220 still points to row 00, and cells "m", "i", "e", and "a" (FIG. 2) are written. As depicted in FIGS. 4-1L, in the present example, the first data bit (indicated by a "1") is written to cell "m" (FIG. 2).

With reference to FIG. 3, during the second read cycle (2H), row 01 is read. As such, with reference to FIGS. 4-2H, address counter 220 is incremented and now points to row 01, and cells "n", "j", "f", and "b" (FIG. 2) are read. As depicted in FIGS. 4-2H, in the present example, memory array 200 remains unchanged from its state during the first write cycle (FIGS. 4-1L).

With reference to FIG. 3, during the second write cycle (2L), row 01 is written. As such, with reference to FIGS. 4-2L, address counter 220 still points to row 01, and cells "n", "j", "f", and "b" (FIG. 2) are written. As depicted in FIGS. 4-2L, in the present example, the second data bit (indicated by a "2") is written to cell "n" (FIG. 2).

With reference to FIG. 3, during the third read cycle (3H), row 10 is read. As such, with reference to FIGS. 4-3H, address counter 220 is incremented and now points to row 10, and cells "o", "k", "g", and "c" (FIG. 2) are read. As depicted in FIGS. 4-3H, in the present example, memory array 200 remains unchanged from its state during the second write cycle (FIGS. 4-2L).

With reference to FIG. 3, during the third write cycle (3L), row 10 is written. As such, with reference to FIGS. 4-3L, address counter 220 still points to row 10, and cells "0", "k", "g", and "c" (FIG. 2) are written. As depicted in FIGS. 4-3L, in the present example, the third data bit (indicated by a "3") is written to cell "o" (FIG. 2).

With reference to FIG. 3, during the fourth read cycle (4H), row 11 is read. As such, with reference to FIGS. 4-4H, address counter 220 is incremented and now points to row 11, and cells "p", "1", "h", and "d" (FIG. 2) are read. As depicted in FIGS. 4-4H, in the present example, memory array 200 remains unchanged from its state during the third write cycle (FIGS. 4-3L).

With reference to FIG. 3, during the fourth write cycle (4L), row 11 is written. As such, with reference to FIGS. 4-4L, address counter 220 still points to row 11, and cells "p", "1", "h", and "d" (FIG. 2) are written. As depicted in FIGS. 4-4L, in the present example, the fourth data bit (indicated by a "4") is written to cell "p" (FIG. 2).

With reference to FIG. 3, during the fifth read cycle (5H), row 00 is read again. As such, with reference to FIGS. 4-5H, address counter 220 is reset and points again to row 00, and cells "m", "i", "e", and "a" (FIG. 2) are read. As depicted in FIGS. 4-5H, in the present example, memory array 200 remains unchanged from its state during the fourth write cycle (FIGS. 4-4L).

With reference to FIG. 3, during the fifth write cycle (5L), row 00 is written. As such, with reference to FIGS. 4-5L, address counter 220 still points to row 00, and cells m "i", "e", and "a" (FIG. 2) are written. As depicted in FIGS. 4-5L, in the present example, the fifth data bit (indicated by a "5") is written to cell "m" (FIG. 2), and the first data bit (indicated by a "1") is written to cell "i" (FIG. 2). As such, with reference to FIG. 2, the first data bit is shifted from cell "m" in column 202A to cell "j" in column 202B (FIG. 2).

In this manner, data can be shifted between columns 202 (FIG. 2) of memory array 200. Additionally, when the data is shifted between columns 202, it is kept within memory array 200. This has the advantage of reducing delay in shifting data between columns 202 and in not consuming general routing capacity.

In contrast, when a conventional memory array is operated as a shift register, the data is typically routed out of the memory array and back into the memory array through general purpose routing. For example, assuming that memory array 200 is operated in this conventional manner, when data is shifted from column 202A to column 202B, data would be sent out output 206A and onto the general routing lines and input 212A into column 206B. This has the disadvantage that it can consume additional time and general data routing capacity.

Thus far, memory array 200 has been described and depicted as an array of 4 rows and 4 columns (i.e., a (4×4) array). As such, memory array 200 has been described and depicted as operating as a 16-bit shift register having a tap length of 4-bits. As noted earlier, it should be recognized that memory array 200 can include any number of rows and columns (i.e., (m×n) array) that can operate as a (m times n)-bit shift register having a tap length of m-bits. To operate as a (m times n)-bit shift register, memory array 200 includes (n−1) multiplexers 210 and address counter 220 having n-states.

For example, in one exemplary configuration, memory array 200 includes 32 rows and 18 columns of memory cells 222. As such, memory array 200 can be operated as a 576-bit shift register having a tap length of 32-bits. In this configuration, memory array 200 includes 17 multiplexers 210, and address counter 220 is a 5-bit counter having 32 states.

In another exemplary configuration, memory array 200 can includes 128 rows and 36 columns of memory cells 222. As such, memory 200 can be operated as a 4608-bit shift register having a tap length of 128-bits. In this configuration, memory array 200 includes 36 multiplexers 210, and address counter 220 is a 7-bit counter having 128 states.

Additionally, it should be recognized that memory array 200 can be implemented as a component of various devices. For example, memory array 200 can operate as a shift-register component in a programmable logic device (PLD). Memory array 200 can also be utilized in any number of applications. For example, memory array 200 can be utilized in Digital Signal Processing (DSP) applications.

Although the present invention has been described in conjunction with particular embodiments illustrated in the appended drawing figures, various modifications can be made without departing from the spirit and scope of the invention. Therefore, the present invention should not be construed as limited to the specific forms shown in the drawings and described above.

We claim:

1. A memory array configured to operate as a shift register, comprising:
   a first column of memory cells having an input and an output;
   at least a second column of memory cells having an input and an output;
   a multiplexer connected between the output of the first column and the input of the at least second column; and
   an address counter configured to point to a row of memory cells in the memory array, wherein the row of memory cells pointed to by the address counter is read and written, and wherein the address counter cycles to point to each row of memory cells in memory array.

2. The memory array of claim 1 further comprising:
   a switch connected to the multiplexer,
   wherein the switch operates between a first mode and at least a second mode.

3. The memory array of claim 2, wherein the input of the second column receives data from the output of the first column when the switch is in the first mode.

4. The memory array of claim 3, where the input of the second column receives data from a general routing line when the switch is in the second mode.

5. The memory array of claim 2, wherein the switch is a RAM bit.

6. The memory array of claim 1 further comprising:
   a first tap line connected the output of the first column; and
   at least a second tap line connected to the output of the second column.

7. The memory array of claim 1,
   wherein the address counter is configured to store a read and write row address.

8. The memory array of claim 1, wherein the row of memory cells pointed to by the address counter is read and written during a single clock cycle.

9. The memory array of claim 8, wherein the row of memory cells pointed to by the address counter is read during one half of the single clock cycle and written during the other half of the single clock cycle.

10. The memory array of claim 1, wherein the address counter has a number of possible states that is equal to the number of rows of memory cells in the memory array.

11. A memory array having a plurality of memory cells arranged in a plurality of rows and columns comprising:
   a first column of memory cells;
   at least a second column of memory cells;
   a multiplexer having:
      a first input conned to the first column of memory cells, and
      an output connected to the second column of memory cells; and
   an address counter configured point to a row of memory cells in the memory array, wherein the row of memory cells pointed to by the address counter is read and written, and wherein the address counter cycle to point to each of the memory cells in the memory array.

12. The memory array of claim 11, wherein the row of memory cells pointed to by the address counter is read and written during a single clock cycle.

13. The memory array of claim 12, wherein the row of memory cells pointed to by the address counter is read during one half of the single clock cycle.

14. The memory array of claim 12, wherein the row of memory cells pointed to by the address counter is written during one half of the single clock cycle.

15. The memory array of claim 12, wherein the address counter has a number of possible states that is equal to the number of rows of memory cells in the memory array.

16. The memory array of claim 1, wherein the multiplexer has a second input connected to a data pin.

17. The memory array of claim 16 further comprising:
   a RAM bit connected to the multiplexer, wherein the RAM bit includes:
      a first mode that selects the first input of the multiplexer, and
      a second mode that selects the second input of the multiplexer.

18. The memory array of claim 1 further comprising:
   a plurality of taps connected to the columns of memory cells.

19. The memory array of claim 18, where the plurality of taps includes:
   a first tap connected to the first column of memory cells; and
   a second tap connected to the second column of memory cells.

20. A method of operating a memory array having a plurality of memory cells arranged in rows and columns as a register, comprising:
   reading data from a row of memory cells pointed to by an address counter;
   writing data to the row of memory cells pointed to by the address counter;
   shifting data from a memory cell in the read row of memory cells in a first column of memory cells to a memory cell in the written row of memory cells in a second column of memory cells through a multiplexer connected between the output of the first column of memory cells and the input of the second column of memory cells; and
   cycling the address counter to point to each row of memory cells of the memory array to read data from and write data to each row of memory cells of the memory array.

21. The method of claim 20, wherein a row of memory cells is read and written during the same clock cycle.

22. The method of claim 21, wherein a row of memory cells is read during half of the clock cycle and written during the other half of the same clock cycle.

* * * * *